(12) United States Patent
Jawarani et al.

(10) Patent No.: US 7,235,471 B2
(45) Date of Patent: Jun. 26, 2007

(54) METHOD FOR FORMING A SEMICONDUCTOR DEVICE HAVING A SILICIDE LAYER

(75) Inventors: Dharmesh Jawarani, Round Rock, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 21 days.

(21) Appl. No.: 10/854,389

(22) Filed: May 26, 2004

(65) Prior Publication Data

US 2005/0277275 A1 Dec. 15, 2005

(51) Int. Cl.
*H01L 21/28* (2006.01)
*H01L 21/44* (2006.01)

(52) U.S. Cl. ............... 438/581; 438/656; 438/682

(58) Field of Classification Search ........... 438/581, 438/649, 651, 655, 656, 659, 664, 682
See application file for complete search history.

(56) References Cited

U.S. PATENT DOCUMENTS

| | | | |
|---|---|---|---|
| 5,150,178 A * | 9/1992 | Mori ........................ | 257/315 |
| 5,851,922 A * | 12/1998 | Bevk et al. ................ | 438/655 |
| 6,107,211 A * | 8/2000 | Tseng ....................... | 438/734 |
| 6,156,632 A * | 12/2000 | Schuegraf ................. | 438/592 |
| 6,285,055 B1 * | 9/2001 | Gosain et al. ............. | 257/317 |
| 6,306,698 B1 * | 10/2001 | Wieczorek et al. ........ | 438/197 |
| 6,391,767 B1 | 5/2002 | Huster | |
| 6,657,244 B1 * | 12/2003 | Dokumaci et al. ........ | 257/288 |
| 6,867,130 B1 * | 3/2005 | Karlsson et al. .......... | 438/655 |
| 2002/0142596 A1 | 10/2002 | Wang | |
| 2004/0016973 A1 * | 1/2004 | Rotondaro et al. ....... | 257/374 |
| 2004/0238876 A1 * | 12/2004 | Youn et al. ............... | 257/315 |

OTHER PUBLICATIONS

Chowdhury et al., Line Edge Reduction for Advanced Metal Gate Etch with 193nm Lithography in a Silicon Decoupled Plasma Source Etcher (DPSII), Proceedings of SPIE vol. 5039 (2003), pp. 240-248.

Bae et al., "Improvement of $CoSi_2$ Stability on Fine Grain Sized Poly-Si Using Nitrogen Implantation Through Co Monosilicide and its Effect on 0.18 μm Dual Gate CMOS," Symposium on VLSI Technology Digest of Techical Papers (1999), pp. 53-54.

(Continued)

*Primary Examiner*—Phuc T. Dang
(74) *Attorney, Agent, or Firm*—Kim-Marie Vo (57) ABSTRACT

A method for forming a semiconductor device includes providing a semiconductor substrate, forming an insulating layer over the semiconductor substrate, forming a conductive layer over the insulating layer, forming a first metal silicide layer over the conductive layer, patterning the conductive layer to form a patterned first layer, wherein the patterned first layer is a part of a control electrode, patterning the first metal silicide layer to form a patterned first metal silicide layer over the control electrode so that the patterned first metal silicide layer remains over the control electrode, and forming a second metal silicide over the patterned metal silicide layer, wherein the second metal silicide layer has a thickness greater than the thickness of first metal silicide layer.

19 Claims, 4 Drawing Sheets

OTHER PUBLICATIONS

Sun et al., "Suppression of Cobalt Silicide Agglomeration Using Nitrogen ($N^+_2$) Implantation," IEEE Electron Device Letters, vol. 19, No. 5, May 1998, pp. 163-166.

Sun et al., "Mechanism of Improved Thermal Stability of Cobalt Silicide Formed on Polysilicon Gate by Nitrogen Implantation," Jpn. J. Appl. Phys. vol. 37 (1998), pp. 5854-5860.

* cited by examiner

METHOD FOR FORMING A SEMICONDUCTOR DEVICE HAVING A SILICIDE LAYER

FIELD OF THE INVENTION

This invention relates generally to forming semiconductor devices, and more specifically, to forming silicide layers of semiconductor devices.

BACKGROUND

The semiconductor industry continually shrinks device dimensions to create faster devices. One such feature that is decreased is the width of polysilicon lines, which form the gate electrode of transistors. Metal silicide, formed on narrow polysilicon lines, improves contact resistance between the polysilicon line and other subsequently formed conductive lines. The metal silicide is formed by depositing a metal layer on the narrow polysilicon line and annealing the metal layer so that it reacts with the polysilicon line and forms a metal silicide. However, when forming a metal silicide over a narrow polysilicon line, it is difficult to nucleate the metal silicide. Poor nucleation results in large variations of thickness and often in noncontinuous layers, which undesirably increase the line sheet resistance of the layer. Due to the increase in line sheet resistance, devices being formed fail and yield decreases. Therefore, a need exists to form metal silicide over narrow polysilicon lines without decreasing yield.

BRIEF DESCRIPTION OF THE DRAWING

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In contrast to the prior art, metal silicide is not nucleated on a narrow polysilicon line. Instead, a thin metal silicide layer is nucleated on a wider polysilicon region that is later etched to form the narrow polysilicon region. In one embodiment, the wider polysilicon region is blanket polysilicon such that it is deposited over all exposed surfaces of the semiconductor substrate. In one embodiment, the wider polysilicon region is blanket polysilicon. The wider polysilicon allows for uniform nucleation. Because the metal silicide layer is thin it can be etched while patterning the underlying polysilicon to form narrow polysilicon lines. Subsequently, a thicker metal silicide is formed over the thin metal silicide layer. In one embodiment, the combined thickness of the thin metal silicide layer and the thicker metal silicide layer is approximately equal to the thickness of the metal silicide formed over the narrow polysilicon lines in the prior art. The resulting structure has a continuous and uniform metal silicide over narrow polysilicon regions, but yield is not sacrificed. A more detailed understanding can be gained from a detailed description of the figures.

Figure 1:
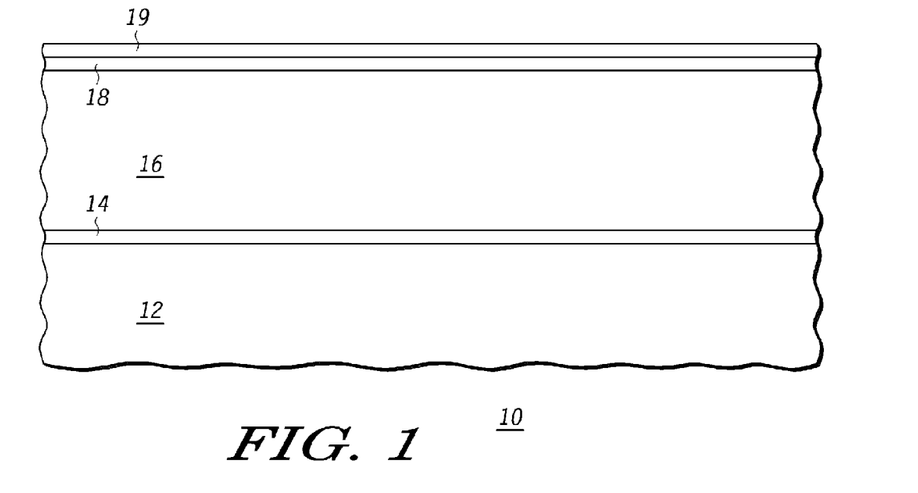
FIG. 1 illustrates a cross-section of a portion of a semiconductor device having layers in accordance with an embodiment of the present invention.
Figure 5:
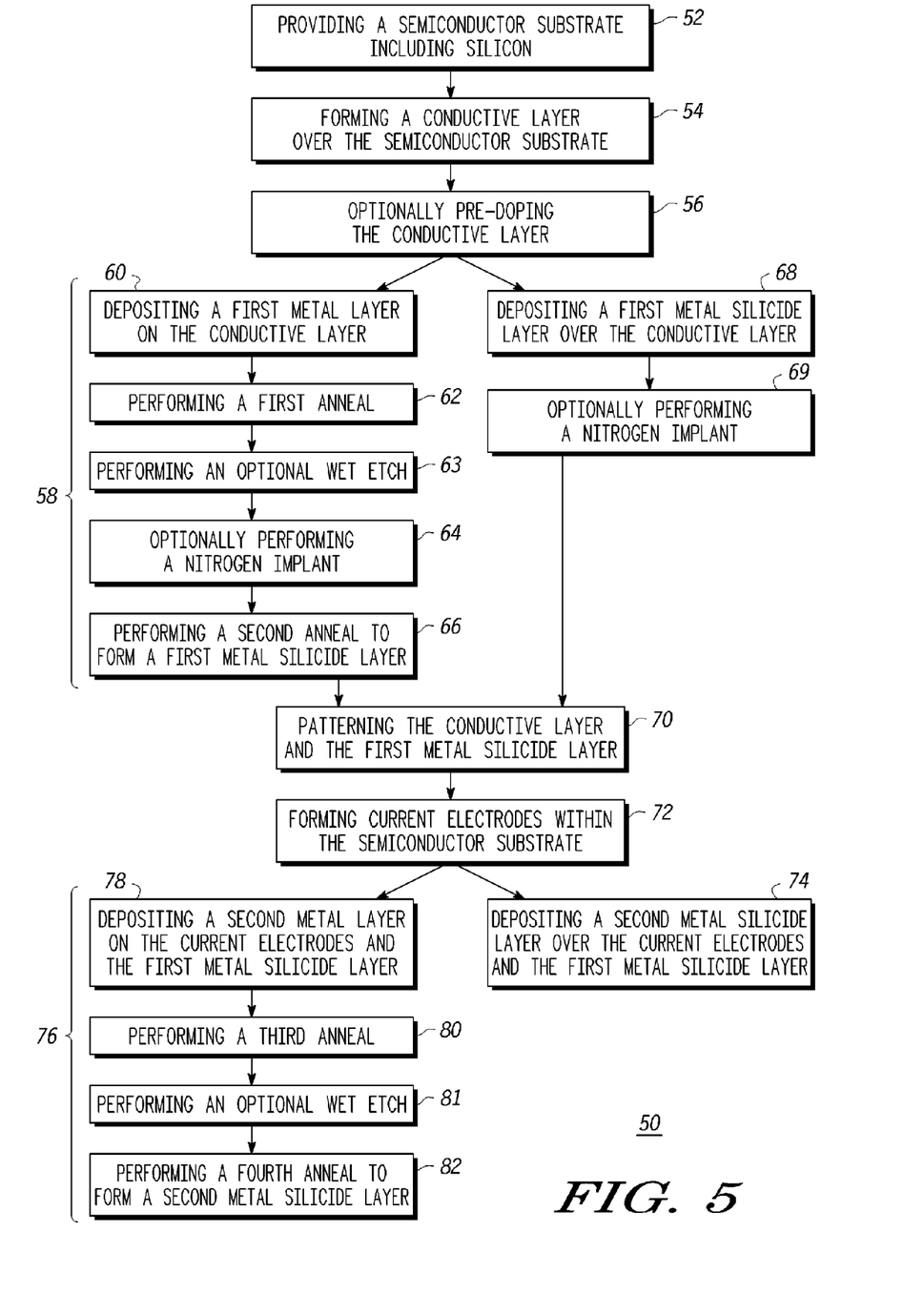
FIG. 5 illustrates a process flow for the processes outlined in FIGS. 1–4 in accordance with an embodiment of the present invention.

Illustrated in FIG. 1 is a portion of a semiconductor device 10 having a semiconductor substrate 12, an insulating layer 14, a conductive layer 16, a first metal silicide layer 18 and an antireflective layer 19. The semiconductor substrate 10 is provided 52 as shown in FIG. 5 and can be any semiconductor material or combinations of materials, such as gallium arsenide, silicon germanium, silicon-on-insulator (SOI), silicon, monocrystalline silicon, the like, and combinations of the above. A portion of the insulating layer 14 will serve as a gate dielectric and hence can be any suitable insulating material such as silicon dioxide ($SiO_2$) or a high-dielectric (hi-k) constant material (i.e., a material having a dielectric constant greater than silicon dioxide), such as hafnium oxide ($HfO_2$) and zirconium oxide ($ZrO_2$) or combinations of the above, such as silicon dioxide and hafnium oxide. (As used in this application, the word "layer" refers to one or more layers. For example, the insulating layer 14 may include a layer of silicon dioxide and a layer of hafnium oxide.) The insulating layer 14 can be thermally grown from a semiconductor substrate including silicon to form silicon dioxide or it may be deposited by chemical vapor deposition, (CVD), atomic layer deposition (ALD), physical vapor deposition (PVD), the like or combinations of the above. The conductive layer 16 is deposited 54 (see FIG. 5) over the semiconductor substrate 12 and may include silicon, (e.g., polysilicon, which may be doped), a metal, the like, or combinations of the above. For example, the conductive layer 16 may include titanium nitride (TiN), tantalum nitride (TaN), or both. As will become apparent after further discussion if the overlying metal silicide layer is formed by depositing a metal and then performing an anneal then the conductive layer 16 should include silicon; however, if the metal silicide layer is to be deposited any material can be used. If an anneal is used, it is preferable that the conductive layer 16 has a top portion that includes silicon so that the silicon can react with a metal layer and form a metal silicide. It is not necessary that the top portion be the top most portion of the conductive layer; instead, the top portion must be sufficiently close to the subsequently formed metal layer to enable a reaction between the silicon in the top portion and the metal layer. If the conductive layer 16 is polysilicon, for example, it may be optionally doped 56 (see FIG. 5) using conventional processing to become more conductive (In addition, if the conductive layer 16 is doped the depletion effect in polysilicon may desirably be lowered. A portion of the conductive layer, which may be a gate electrode stack, will serve as a control or gate electrode of the semiconductor device 10 and hence, a skilled artisan can choose a thickness and material for this layer commensurate with its function as a gate electrode. For example, the conductive layer 16 may be approximately 100 nanometers of polysilicon. As will be explained in more detail below, in some embodiments, it may be desirable to make the conductive layer 16 thicker than desirable for the gate electrode because the thickness may decrease during processing.

After forming the conductive layer 16, the metal silicide layer is formed either using a first process 58 or a second process 68, as shown in FIG. 5. In the first process 58, a first metal layer, such as cobalt, nickel or titanium, is deposited 60 on the conductive layer 16, in one embodiment, by sputtering (a form of PVD). In one embodiment, the first metal layer is at least a monolayer in thickness but less then approximately 8 nanometers. Eight nanometers is preferred as the upper limit of the thickness because if the metal layer is thicker it may be difficult to etch the resulting metal silicide layer while etching the conductive layer 16. In one embodiment, the metal first layer has a thickness between approximately 2 to approximately 7 nanometers or more preferably approximately 3 nanometers or approximately 4 nanometers. Next, a first anneal is performed 62, at a first temperature, which in an embodiment where the first metal layer includes cobalt, is a rapid thermal anneal at approximately 450 degrees Celsius to form a first metal silicide. The first anneal forms an initial silicide phase (first metal silicide) over the conductive portions of the semiconductor device while avoiding such formation over the insulating regions, such as the field oxide and the spacer regions of the semiconductor device 10. After performing the first anneal, an optional wet etch may be used 63 to remove any unreacted metal that may be overlying the insulating regions.

An optional nitrogen implant may be performed 64 after the first anneal and after the optional wet etch 63, if performed. The nitrogen implant helps prevent agglomeration of the first metal silicide layer during subsequent high temperature processing, thereby helping keep the first metal silicide layer uniform and continuous. In one embodiment, the nitrogen implant is performed as a straight implant (i.e., perpendicular to the semiconductor device 10) with a dosage between approximately 1E14 to approximately 5E15 atoms per centimeter squared, or more preferably approximately 1.5E15 atoms per centimeter squared, at an energy between approximately 0.7 KeV to approximately 10 KeV, or more preferably approximately 1.5 KeV. After the optional implant, a second anneal may be performed 66 at a second temperature, which in an embodiment where the first metal layer includes cobalt is a rapid thermal anneal at approximately 700 degrees Celsius to form a second metal silicide. The second metal silicide has a lower resistivity than the first metal silicide. In one embodiment, the first temperature of the first anneal is less than the second temperature of the second anneal. The second anneal may not be performed if the first anneal is great enough to form a metal silicide layer with the desired low resistivity. During annealing, the metal layer reacts with silicon in the conductive layer 16 and forms a first metal silicide layer 18. Due to the reaction, the first metal silicide layer 18 should consume substantially the entire metal layer that was formed and some of the conductive layer 16. (Each angstrom of the metal layer will consume approximately 3.6 angstroms of a polysilicon conductive layer when the metal layer is cobalt.) In one embodiment, the first metal silicide layer will have a thickness of less than 25 nanometers after the second anneal.

Alternatively, the process 68 can be performed. In this embodiment, a first metal silicide layer 18 is deposited, which can be performed by CVD, ALD, the like or combinations of the above. Preferably, the first metal silicide layer is less than 25 nanometers in thickness so that it is easily etched during the subsequent patterning process. Since in this embodiment the underlying conductive layer 16 is not consumed to form the first metal silicide layer 18, one advantage of using the process 68 is that a thinner conductive layer 16 can be formed than when using the process 58, where the consumption of the conductive layer 16 may be taken into account when forming the conductive layer 16. An optional nitrogen implant may be performed 69 after depositing 68 the first metal silicide layer over the conductive layer. The nitrogen implant helps prevent agglomeration of the metal silicide layer during subsequent high temperature processing steps thereby helping keep the metal silicide layer uniform and continuous. In one embodiment, the nitrogen implant is performed as a straight implant (i.e., perpendicular to the semiconductor device 10) with a dosage between approximately 1E14 to approximately 5E15 atoms per centimeter squared, or more preferably approximately 1.5E15 atoms per centimeter squared, at an energy between approximately 0.7 KeV to approximately 10 KeV, or more preferably approximately 1.5 KeV.

After forming the first metal silicide layer 18, an ARC (anti-reflective coating) layer 19 is optionally formed. In one embodiment, the ARC layer 19 includes two layers. The first layer may include a DARC (dielectric ARC). In one embodiment the DARC includes an oxide-based film, nitride-based film, the like, or combinations of the above, with a thickness between approximately 10 nanometers to approximately 100 nanometers. However, the film thickness may vary as it depends on optical properties and etch resistance of the material used. A thinner silicon-rich nitride film, which may be approximately 20 nanometers in thickness, may be used if overlying, subsequently formed, photoresist is used as a masking layer. If a non-photoresist hardmask is used instead of the photoresist, the thickness may be approximately greater than approximately 50 nanometers. The first layer may include a BARC (bottom ARC), which in one embodiment is a spin-on organic material, such as Clariant 1C1B with a thickness between approximately 10 nanometers to approximately 1000 nanometers. To provide the best combination of optical properties, the BARC thickness may be chosen to be the same thickness as the subsequently formed photoresist layer, such as Sumitomo 193 nm-sensitive PAR-707. Under the first layer of the ARC layer 19, a second layer of the ARC layer 19 may include an OARC (organic ARC), such as the Applied Materials APF film with a thickness between approximately 10 nanometers to approximately 100 nanometers. Alternatively, the second layer may be a hardmask, such as silicon nitride, which may have a thickness greater than approximately 50 nanometers in thickness. The ARC layer 19 may be deposited using CVD, PVD, ALD, spin-on, the like or combinations of the above. The ARC layer 19 is optionally used to help reduce reflection while patterning underlying layers. Alternate patterning methods may also be used, including bi-layer pattern systems.

Figure 2:
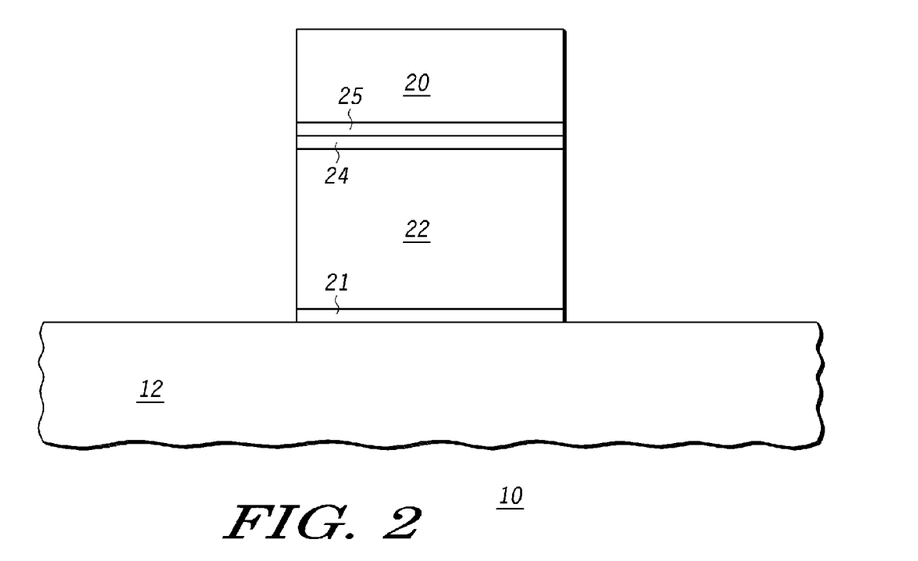
FIG. 2 illustrates the semiconductor device of FIG. 1 after patterning the layers in accordance with an embodiment of the present invention.

After forming the first metal silicide layer 18 and the ARC layer 19 if present, the first metal silicide layer 18, the ARC layer 19 (if present) and the conductive layer 16 are patterned 70, as illustrated in FIG. 2 to form the ARC 25 (if present), the first metal silicide layer 24 and the gate or control electrode 22. In one embodiment, a (positive or negative) photoresist layer 20 is formed and patterned over the semiconductor substrate 10 in order to form the ARC 25 (if present), the first metal silicide layer 24 and the gate or control electrode 22. In one embodiment, the first metal silicide layer 18 and the conductive layer 16 are etched using an etch chemistry for the conductive layer 16, such as fluorine-based chemistries like $CF_4$ or $SF_6$, chlorine based chemistries, such as $Cl_2$ or $BCl_3$, or combinations of the above if the first metal silicide layer 18 is cobalt silicide and the conductive layer 16 is polysilicon. The insulating layer 14 may also be patterned at this time to form a gate insulating layer 21, but alternatively may not be patterned. After patterning, the photoresist layer 20 and the ARC 25, if present, are removed. In one embodiment, a combination of dry ash and wet etch processing is performed to remove the photoresist layer 20 and the ARC 25, if present.

After removing the photoresist layer 20 and the ARC 25, if present, a source extension 26 and a drain extension 28 may be formed by implanting at zero degrees relative to the normal to the surface of the semiconductor substrate 12 or at an angle. In one embodiment, the doping concentration may be between approximately 1E19 to 5E20 atoms per centimeters cubed of either an n-type (e.g., phosphorus) or p-type (e.g., boron) dopant.

Figure 3:
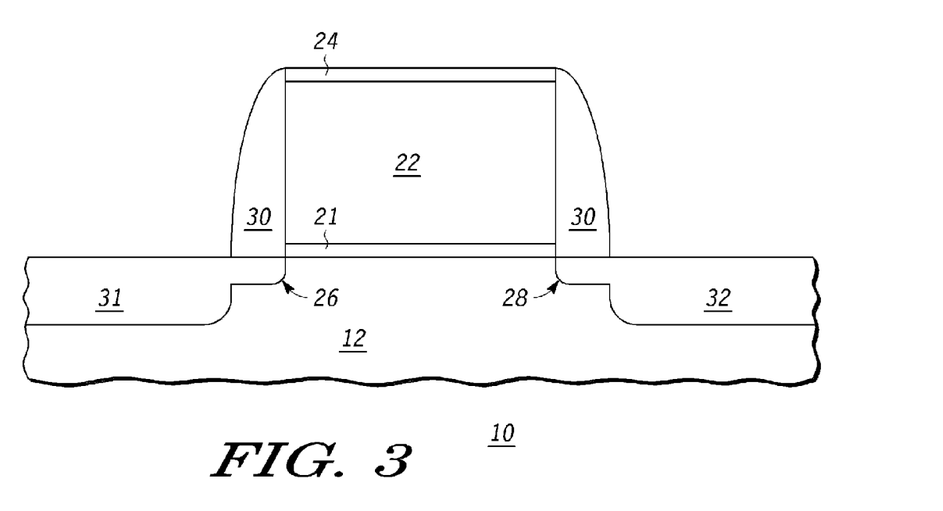
FIG. 3 illustrates the semiconductor device of FIG. 2 after forming spacers, a source region and a drain region in accordance with an embodiment of the present invention.

After forming the source extension 26 and the drain extension 28, spacers 30 are formed along the sides of the control electrode 22, the first metal silicide 24 and the gate insulator 21 (if patterned, and if not patterned the spacers 30 are formed over the gate insulator 21). The spacers 30 may be formed by depositing an insulating layer, such as silicon nitride ($Si_xN_y$), over the semiconductor device 10 and anisotropically etching the insulating layer using conventional chemistries. Other spacer implementations and structures, such as "L-shaped" spacers, may be used alone or in conjunction with the spacers 30 as illustrated. After forming the spacers 30, deep source 31 and a deep drain 32 are formed in the semiconductor substrate 12.

The deep source 31 and deep drain 32 may be formed using the spacers 30 and the first metal silicide layer 24 and control electrode 22 as a mask. The same dopants that were used to form the source extension 26 and the drain extension 28 may be used; however, the dopant concentration will be greater than that used to form the extensions 26 and 28. In one embodiment, the doping concentration may be between approximately 5E19 to 1E21 atoms per centimeters cubed of either an n-type (e.g., phosphorus) or p-type (e.g., boron) dopant. The source extension 26 and the deep source 31 form the source region (a current electrode) of the semiconductor device 10 and the drain extension 28 and the deep drain 32 form the drain region (a current electrode) of the semiconductor device 10, which are formed in process 72 in FIG. 5.

Figure 4:
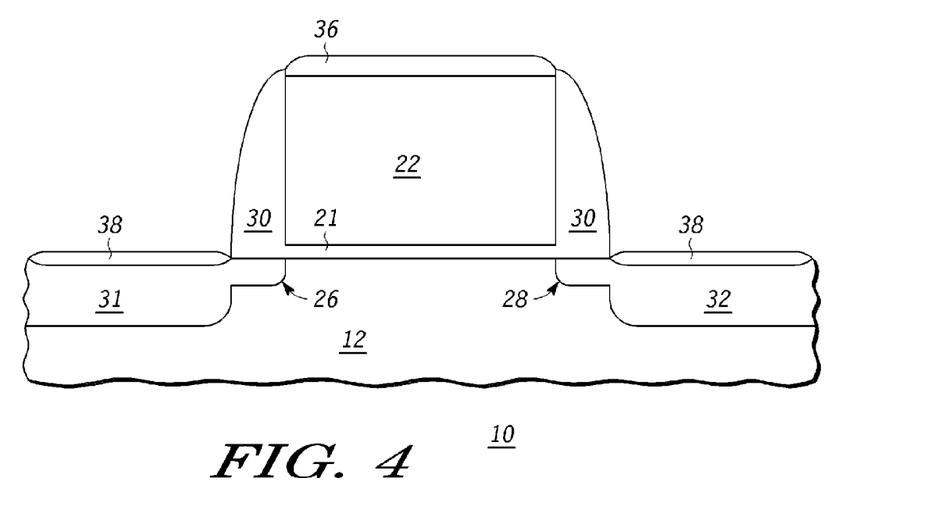
FIG. 4 illustrates the semiconductor device of FIG. 3 after forming a metal silicide layer in accordance with an embodiment of the present invention.

After forming the current electrodes, a second metal silicide layer 36 and 38 is formed over the first metal silicide and the current electrodes. The second metal silicide layer 36 may be formed by process 76 or process 74 in FIG. 5. For process 76, a second layer metal layer, such as cobalt, nickel or titanium, is deposited. In one embodiment, approximately 4 to 15 nanometers of metal is deposited by sputtering. After being deposited, the metal is annealed 80 at a first temperature and then annealed 82 at a second temperature which is greater than the first temperature. In between the first and second annealing processes 80 and 82, an optional etch process, such as a wet etch, may be performed 81 to remove any unreacted metal from the non-conductive portions of the device such as the field or the isolation oxide and from over the spacers 30. In one embodiment, the first temperature is approximately 45° degrees Celsius and the second temperature is approximately 700 degrees Celsius when using cobalt. During the first anneal, the second metal layer diffuses through the thin first metal silicide layer in the area over the gate electrode 22 and reacts with silicon in the gate electrode 22 so as to form a metal silicide. For example, it has been shown that cobalt will easily diffuse through approximately 7 nanometers of cobalt silicide to form a thicker cobalt silicide. The same process used to form the first metal silicide layer can be used. Since the first metal silicide layer is present, the nucleation of the second metal silicide layer is easy, and a uniform metal silicide over narrow polysilicon lines is formed. Alternatively, the second metal silicide layer can be formed by process 74 where the second metal silicide layer may be selectively deposited by CVD, ALD, the like or combinations of the above. The deposited second metal silicide layer is selective to the conductive regions. In one embodiment, the resulting second metal silicide layer 36 is approximately 15 nanometers to approximately 40 nanometers, or more preferably approximately 30 nanometers, in the area over the gate electrode 22. (This measurement includes the total thickness of all the metal silicide over the gate electrode 22.) In one embodiment, the resulting second metal silicide layer 38 and 39 is approximately 15 nanometers to approximately 40 nanometers, or more preferably approximately 20 nanometers, in the areas over the current electrodes, which are the active areas. The second metal silicide layer 36,38, and 39 is thicker in the area over the control electrode 22 because in this region 36 the second metal silicide layer includes the first metal silicide layer. The second metal silicide layer 38 and 39 over the current electrodes is thinner than the second metal silicide layer 36 over the gate electrode 22 because the former does not merge with any underlying metal silicide layer. Like the first metal silicide layer, when the second metal silicide layer is formed by annealing and reacting with the underlying layer, the metal silicide layer will consume some of the silicon in the underlying layer, as illustrated in FIG. 4. In this embodiment, the underlying layer should include silicon, but it is not necessary if the metal silicide layer is deposited.

Titanium silicide, cobalt silicide and nickel silicide are desirable materials for both the first and second metal silicide layer because they have a thin film resistivity approximately in the range of 13–20 µ-ohm-cm. The metals in these silicides can all be lower temperature refractory metal layers. (Titanium silicide can be viewed alternatively as an intermediate refractory metal, but for purposes herein will be a lower temperature refractory metal.)

Figure 6:
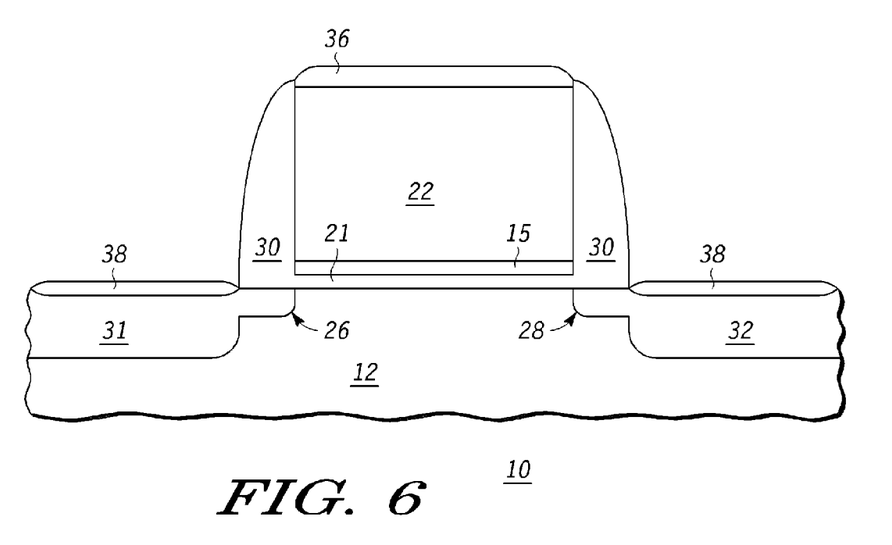
FIG. 6 illustrates a cross-section of a semiconductor device in accordance with an embodiment of the present invention.

FIG. 6 illustrates a cross-section of the semiconductor device 10 having a metal layer 15. In one embodiment, the metal layer 15 is formed under the conductive layer 22 and the metal layer 15 is patterned to form at least a part of the control electrode.

By now it should be appreciated that there has been provided a method to form uniform metal silicide over thin areas, such as polysilicon lines or gate electrodes. The result is improved yield.

In the foregoing specification, the invention has been described with reference to specific embodiments. However, one of ordinary skill in the art appreciates that various modifications and changes can be made without departing from the scope of the present invention as set forth in the claims below. For example, the first and the second silicidation anneal can be replaced by a single high temperature anneal to form the final low resistivity phase prior to a nitrogen implant. In addition, the source and drain regions can be reversed. For example, the drain extension 28 and the deep drain 32 may be the source extension 28 and the deep source 32. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. A method for forming a semiconductor device, the method comprising:
    providing a semiconductor substrate;
    forming an insulating layer over the semiconductor substrate;
    forming a conductive layer over the insulating layer;
    forming a first metal silicide layer over the conductive layer by performing an anneal and implanting nitrogen into the first metal silicide layer, wherein the first metal silicide has a first thickness;
    patterning the conductive layer to form a patterned first layer, wherein the patterned first layer is at least a part of a control electrode;
    patterning the first metal silicide layer to form a patterned first metal silicide layer over the control electrode so that the patterned first metal silicide layer remains over the control electrode; and
    forming a second metal silicide over the patterned metal silicide layer, wherein the second metal silicide layer comprises the first metal silicide layer, the second metal silicide layer has a second thickness, and the second thickness of the second metal silicide layer is greater than the first thickness of first metal silicide layer.

2. The method of claim 1, wherein the first thickness is less than approximately 25 nanometers and the second thickness is less than approximately 40 nanometers.

3. The method of claim 1, wherein forming a first metal silicide layer comprises forming a first metal silicide layer selected from the group consisting of nickel silicide, cobalt silicide and titanium silicide.

4. The method of claim 3, wherein the second metal silicide consists of the same material.

5. The method of claim 3, wherein the second metal silicide consists of different materials.

6. The method of claim 1, wherein forming the second metal silicide layer further comprises depositing a third metal silicide layer over the first metal silicide layer using a process selected from the group consisting of chemical vapor deposition (CVD) and atomic layer deposition (ALD).

7. The method of claim 1, wherein forming the second metal silicide layer further comprises:
    sputtering a metal layer on the first layer;
    performing a first anneal at a first temperature; and
    performing a second anneal at a second temperature, wherein the second temperature is greater than the first temperature.

8. A method for forming a semiconductor device, the method comprising:
    providing a semiconductor substrate;
    forming an insulating layer over the semiconductor substrate;
    forming a polysilicon layer over the insulating layer;
    forming a first metal silicide layer over the polysilicon layer by performing an anneal and implanting nitrogen into the first metal silicide layer, wherein the first metal silicide layer comprises silicon and one of cobalt and nickel;
    patterning the first metal silicide layer and the polysilicon layer;
    forming a second metal silicide over the patterned metal silicide layer, wherein the second metal silicide and the first metal silicide form a combined metal silicide region.

9. The method of claim 8, wherein the second metal silicide is a different material than the first metal silicide.

10. The method of claim 8, wherein the second metal silicide is a same material as the first metal silicide.

11. The method of claim 8, wherein forming the first metal silicide layer over the first layer further comprises depositing the first metal silicide layer using a process selected from the group consisting of chemical vapor deposition (CVD) and atomic layer deposition (ALD).

12. The method of claim 8, wherein forming the first metal silicide layer over the first layer further comprises:
    sputtering a metal layer on the first layer;
    performing a first anneal at a first temperature; and
    performing a second anneal at a second temperature, wherein the second temperature is greater than the first temperature.

13. The method of claim 12, wherein forming the second metal silicide layer further comprises implanting nitrogen into the second metal silicide layer.

14. The method of claim 8, wherein the first metal silicide layer has a first thickness and the combined metal silicide region has a second thickness, wherein the first thickness is less than the second thickness.

15. The method of claim 14, wherein the first thickness is less than approximately 25 nanometers and the second thickness is less than approximately 40 nanometers.

16. A method of forming a semiconductor device, the method comprising:
    providing a semiconductor substrate;
    forming a gate electrode stack over the semiconductor substrate, wherein the gate electrode stack comprises a top layer comprising silicon;
    forming a first metal silicide layer over the top layer by performing an anneal and implanting nitrogen into the first metal silicide layer, wherein the first metal silicide layer comprises one of nickel and cobalt;
    patterning the gate electrode stack to form a gate electrode, wherein patterning the gate electrode stack comprises patterning the metal layer to form at least a part of the gate electrode;
    patterning the first metal silicide layer over the gate electrode stack to form a patterned first metal silicide layer;
    doping the semiconductor substrate laterally adjacent the gate electrode to form active regions; and
    forming a second metal silicide layer over on the first metal silicide layer and the active regions.

17. The method of claim 16, wherein the gate electrode stack consists of the top layer.

18. The method of claim 17, wherein the gate electrode stack further comprises a bottom layer, wherein the bottom layer comprises a metal.

19. The method of claim 1, wherein forming the first metal silicide layer over the conductive layer further comprises depositing the first metal silicide layer using a process selected from the group consisting of chemical vapor deposition (CVD) and atomic layer deposition (ALD).

* * * * *

UNITED STATES PATENT AND TRADEMARK OFFICE
CERTIFICATE OF CORRECTION

PATENT NO. : 7,235,471 B2
APPLICATION NO. : 10/854389
DATED : May 26, 2004
INVENTOR(S) : Dharmesh Jawarani et al.

It is certified that error appears in the above-identified patent and that said Letters Patent is hereby corrected as shown below:

In Column 7, After Line 34, Claim No. 1:

Insert --forming a metal layer under the conductive layer;--

In Column 7, After Line 34, Claim No. 1:

Insert --patterning the metal layer to form at least a part of the control electrode;--

In Column 8, After Line 14, Claim No. 8:

Insert --forming a metal layer under the conductive layer;--

In Column 8, After Line 16, Claim No. 8:

Insert --patterning the metal layer to format at least a part of the control electrode: and--

In Column 7, Line 32, Claim No. 12:

Change "the" to --polysilicon--

UNITED STATES PATENT AND TRADEMARK OFFICE
CERTIFICATE OF CORRECTION

| | |
|---|---|
| PATENT NO. | : 7,235,471 B2 |
| APPLICATION NO. | : 10/854389 |
| DATED | : May 26, 2004 |
| INVENTOR(S) | : Dharmesh Jawarani et al. |

It is certified that error appears in the above-identified patent and that said Letters Patent is hereby corrected as shown below:

In Column 8, Line 52, Claim No. 16:

Insert --and a metal layer under the top layer-- after "silicon"

Signed and Sealed this

First Day of January, 2008

JON W. DUDAS
*Director of the United States Patent and Trademark Office*

UNITED STATES PATENT AND TRADEMARK OFFICE
CERTIFICATE OF CORRECTION

PATENT NO. : 7,235,471 B2  
APPLICATION NO. : 10/854389  
DATED : May 26, 2004  
INVENTOR(S) : Dharmesh Jawarani et al.

Page 1 of 1

It is certified that error appears in the above-identified patent and that said Letters Patent is hereby corrected as shown below:

In Column 7, After Line 34, Claim No. 1:

Insert --forming a metal layer under the conductive layer;--

In Column 7, After Line 34, Claim No. 1:

Insert --patterning the metal layer to form at least a part of the control electrode;--

In Column 8, After Line 14, Claim No. 8:

Insert --forming a metal layer under the conductive layer;--

In Column 8, After Line 16, Claim No. 8:

Insert --patterning the metal layer to form at least a part of the control electrode: and--

In Column 8, Line 32, Claim No. 12:

After "the" insert --polysilicon--

In Column 8, Line 52, Claim No. 16:

Insert --and a metal layer under the top layer-- after "silicon"

Signed and Sealed this

Fifteenth Day of January, 2008

JON W. DUDAS  
*Director of the United States Patent and Trademark Office*

UNITED STATES PATENT AND TRADEMARK OFFICE
CERTIFICATE OF CORRECTION

PATENT NO. : 7,235,471 B2
APPLICATION NO. : 10/854389
DATED : June 26, 2007
INVENTOR(S) : Dharmesh Jawarani et al.

It is certified that error appears in the above-identified patent and that said Letters Patent is hereby corrected as shown below:

In Column 7, After Line 34, Claim No. 1:

Insert --forming a metal layer under the conductive layer;--

In Column 7, After Line 34, Claim No. 1:

Insert --patterning the metal layer to form at least a part of the control electrode;--

In Column 8, After Line 14, Claim No. 8:

Insert --forming a metal layer under the conductive layer;--

In Column 8, After Line 16, Claim No. 8:

Insert --patterning the metal layer to format at least a part of the control electrode: and--

In Column 8, Line 32, Claim No. 12:

Change "the" to --polysilicon--

UNITED STATES PATENT AND TRADEMARK OFFICE
CERTIFICATE OF CORRECTION

| | |
|---|---|
| PATENT NO. | : 7,235,471 B2 |
| APPLICATION NO. | : 10/854389 |
| DATED | : June 26, 2007 |
| INVENTOR(S) | : Dharmesh Jawarani et al. |

It is certified that error appears in the above-identified patent and that said Letters Patent is hereby corrected as shown below:

In Column 8, Line 52, Claim No. 16:

Insert --and a metal layer under the top layer-- after "silicon"

This certificate supersedes the Certificate of Correction issued January 1, 2008.

Signed and Sealed this

Twenty-ninth Day of January, 2008

JON W. DUDAS
*Director of the United States Patent and Trademark Office*

UNITED STATES PATENT AND TRADEMARK OFFICE
CERTIFICATE OF CORRECTION

PATENT NO. : 7,235,471 B2
APPLICATION NO. : 10/854389
DATED : June 26, 2007
INVENTOR(S) : Dharmesh Jawarani et al.

It is certified that error appears in the above-identified patent and that said Letters Patent is hereby corrected as shown below:

In Column 7, After Line 34, Claim No. 1:

Insert --forming a metal layer under the conductive layer;--

In Column 7, After Line 34, Claim No. 1:

Insert --patterning the metal layer to form at least a part of the control electrode;--

In Column 8, After Line 14, Claim No. 8:

Insert --forming a metal layer under the conductive layer;--

In Column 8, After Line 16, Claim No. 8:

Insert --patterning the metal layer to form at least a part of the control electrode: and--

In Column 8, Line 32, Claim No. 12:

After "the" insert --polysilicon--

In Column 8, Line 52, Claim No. 16:

Insert --and a metal layer under the top layer-- after "silicon"

This certificate supersedes all previously issued Certificate of Corrections.

Signed and Sealed this

Nineteenth Day of February, 2008

JON W. DUDAS
*Director of the United States Patent and Trademark Office*